(12) United States Patent
Dunn et al.

(10) Patent No.: US 6,329,792 B1
(45) Date of Patent: Dec. 11, 2001

(54) DEVICE AND SYSTEM FOR MANAGEMENT OF BATTERY BACK UP POWER SOURCE

(75) Inventors: James H. Dunn, Limoges; Julio C. de Oliveira, Gloucester; David H. Gerwing, Greely, all of (CA)

(73) Assignee: Estco Energy Inc., Nepean (CA)

( * ) Notice: Subject to any disclaimer, the term of this patent is extended or adjusted under 35 U.S.C. 154(b) by 0 days.

(21) Appl. No.: 09/446,950

(22) PCT Filed: Jul. 3, 1998

(86) PCT No.: PCT/CA98/00650

§ 371 Date: Mar. 17, 2000

§ 102(e) Date: Mar. 17, 2000

(87) PCT Pub. No.: WO99/01918

PCT Pub. Date: Jan. 14, 1999

(30) Foreign Application Priority Data

Jul. 4, 1997 (CA) .................................................. 2209817

(51) Int. Cl.[7] ...................................................... H02J 7/00
(52) U.S. Cl. ............................................. 320/132; 320/130
(58) Field of Search .................................. 320/132, 130, 320/120, 137, 139, 150, 158, 128; 324/426

(56) References Cited

U.S. PATENT DOCUMENTS

| 4,484,140 | 11/1984 | Dieu ...................................... 320/120 |
| 4,707,795 | 11/1987 | Alber et al. .......................... 324/433 |
| 5,153,496 | 10/1992 | LaForge ................................ 320/119 |
| 5,422,558 | * 6/1995 | Stewart ................................. 320/120 |
| 5,438,250 | * 8/1995 | Retzlaff ................................ 320/128 |
| 5,543,245 | 8/1996 | Andrieu et al. ....................... 320/124 |
| 5,631,537 | * 5/1997 | Armstrong ............................ 320/118 |
| 5,886,503 | * 3/1999 | McAndrews et al. ................ 320/121 |

FOREIGN PATENT DOCUMENTS

| 0 348 839 | 1/1990 | (EP) . |
| 97 28574 | 8/1997 | (WO) . |

\* cited by examiner

*Primary Examiner*—Peter S. Wong
*Assistant Examiner*—Lawrence Luk
(74) *Attorney, Agent, or Firm*—Shapiro Cohen

(57) ABSTRACT

The invention relates to a device for managing battery packs from which it is powered by measuring and monitoring the operating capacity of individual battery modules in a battery pack. A programmable logic controller directs the selective closing of relays to allow individual battery modules to be load-tested using a variable discharge load unit, without compromising useful battery pack capacity. In a further embodiment, the invention can include, for each user, a network of battery management devices with two-way communications links to a central management location with computer based monitoring and control of all battery packs. In addition, a centre of expertise on battery technology is linked to the user networks.

22 Claims, 6 Drawing Sheets

FIG.3 BRIDGED CONNECTION FLOWCHART

INSERTED CONNECTION CIRCUIT

DEVICE AND SYSTEM FOR MANAGEMENT OF BATTERY BACK UP POWER SOURCE

BACKGROUND TO THE INVENTION

The present invention relates to a device and system for the management of a battery pack used as a power back-up for an A.C. power source. The invention has particular application to distributed telecommunication systems and enables the useful capacity and health of a back-up battery power source of one or more of the links in the telecom system to be monitored, assessed and managed from a remote location.

The invention may be used in conjunction with any device or network of devices which is battery-powered, or which uses a battery pack as an alternative or back-up power source, such as telecommunication relay sites, fibre optic sites, computers; telecommunication or station batteries; telephone switching facilities and portable test equipment.

Other potential applications include railway crossing and switch systems; mobile electronic equipment battery packs used in cellular telephones, computers, camcorders or electric vehicles.

There is presently no fully reliable and accurate means for determining the useful capacity of batteries, e.g. those used as a back up for a primary AC power source for an instrument or device which is situated at a remote location. In the event of an AC power failure, it is essential that the DC battery back-up power operate efficiently and at the required capacity. To date, there has been no practical method to load test a back-up battery at a remote site. Conventional devices measure voltage, impedance, electrolyte specific gravity or other battery characteristics, but do not provide the user with direct information concerning the length of time the battery will operate under load.

SUMMARY OF THE INVENTION

The present invention obviates and mitigates the disadvantages inherent in the prior art by providing a device and system for directly assessing the useful capacity of a back-up battery, even where the battery is located at a remote site and without compromising the ability of the back-up battery to operate should there be an AC power failure during the battery testing. This objective is achieved by performing a sequential, individual assessment of each module which comprises a battery pack. Where used in this specification, the term "module" means one or more electrochemical cells.

A further advantage of the present invention arises from its capability to rejuvenate or boost the health of the battery module of certain chemistries, e.g. valve regulated lead acid (VRLA) or nickel/cadmium. The discharge/charge sequence which is carried out in order to assess and monitor the useful capacity of the module, also serves to better cycle the module.

In a preferred embodiment, the present invention provides a method for managing the back-up, battery power source of the distributed communications systems of the telecommunications industry. The invention enables individual telecom sites with fibre optic or radio equipment powered by systems containing back-up batteries to be operated with improved reliability and economy. The invention provides smart charging at the cell or module level, thus ensuring that the back-up battery pack always receives optimum charging. The invention further provides a continuously updated battery pack capacity based on cell or module discharge tests so that the individual sites on the telecom system are provided with a real time method of back-up battery network management. This network battery management system provides the user with information to optimize the efficiency and operability of the telecom system, in case of AC power failure, particularly if the there is a widespread or prolonged AC power outage.

In another embodiment, the invention provides a networked system which enables the back-up battery power source of a system with multiple battery installations to be effectively assessed, monitored and managed.

In a further embodiment, the invention provides a higher level of networked system which has as its hub, a master control center which integrates the application specific networks of users of the primary battery health management devices. This higher system will enable battery health to be expertly managed by enhancing the optimum servicing, reliability and economic operation of the back-up power systems, by providing a means whereby the capacity and health of a battery can be assessed, monitored and managed from a remote site without disruption of the battery circuit.

In one aspect, the invention provides a system for directly assessing the useful capacity of an online battery pack, comprising: a programmable logic controller operatively connected to a monitor circuit and to one or more battery modules comprising said battery pack, said monitor circuit comprising battery module charging means, and discharge load means; wherein said programmable logic controller selectively and sequentially opens and closes a plurality of relays which connect with said charging means and said discharge load means to alternatively define a discharge circuit which enables one of said modules to be discharged by said discharge load means under a predefined load, the useful capacity of said module being calculated by said programmable logic controller.

Preferably, the programmable logic controller comprises, or is operatively connected to at least one module voltage reader; battery pack current reader and module current reader; a switch controller to control said isolation relays; a controller for said variable discharge load means and said single module battery charger (charger/discharger controller).

In an additional aspect, the invention provides a method of sequentially assessing the operating capacity of a plurality of battery modules which define a battery pack, which comprises the steps of:

selecting one of said modules for assessment;

connecting said selected module to a variable discharge load means by closing relays which connect said module to said variable discharge load means;

measuring parameters which define the useful capacity of said module, while said module is under load;

disconnecting said selected module from said variable discharge load means by opening said relays and either;
(a) connecting said selected module to a battery charger for recharging; and (b) reconnecting said selected module to said plurality of modules by the selective opening and closing of relays which connect said modules with said battery charger, and said variable discharge load;

wherein the coordination of all of the above steps is accomplished by the use of a programmable logic controller operatively comprising, in combination, at least one voltage reader; at least one battery pack current reader; at least one module current reader; and a switch controller to control the opening and closing of said relays.

A still further aspect of the invention provides a device for cycling batteries, comprising: a programmable logic controller operatively connected to a monitor circuit and to one or more battery modules comprising said battery pack, said monitor circuit comprising battery module charging means, and discharge load means; wherein said programmable logic controller selectively and sequentially opens and closes a plurality of relays which connect with said charging means and said discharge load means to alternatively define a discharge circuit which enables one of said modules to be discharged by said discharge load means under a predefined load.

An additional aspect of the invention provides a device for enhancing the useful capacity and/or reducing the rate of capacity loss of battery packs during service by using an optimal recharge method on battery modules which comprise said battery pack while said battery pack remains in service.

DESCRIPTION OF THE PREFERRED EMBODIMENT

The device of the present invention comprises a programmable logic controller (PLC) or computer, coupled to a plurality of multi-pole contactors, relays or solid state switching devices.

The device of the present invention may be used in conjunction with rechargeable batteries of various chemical composition(s). Some are sealed, others are flooded while others are valve-regulated batteries. The typical chemistry of the batteries is nickel/cadmium or lead-acid. The threshold voltage is established having regard to the chemistry of the module.

Figure 1:
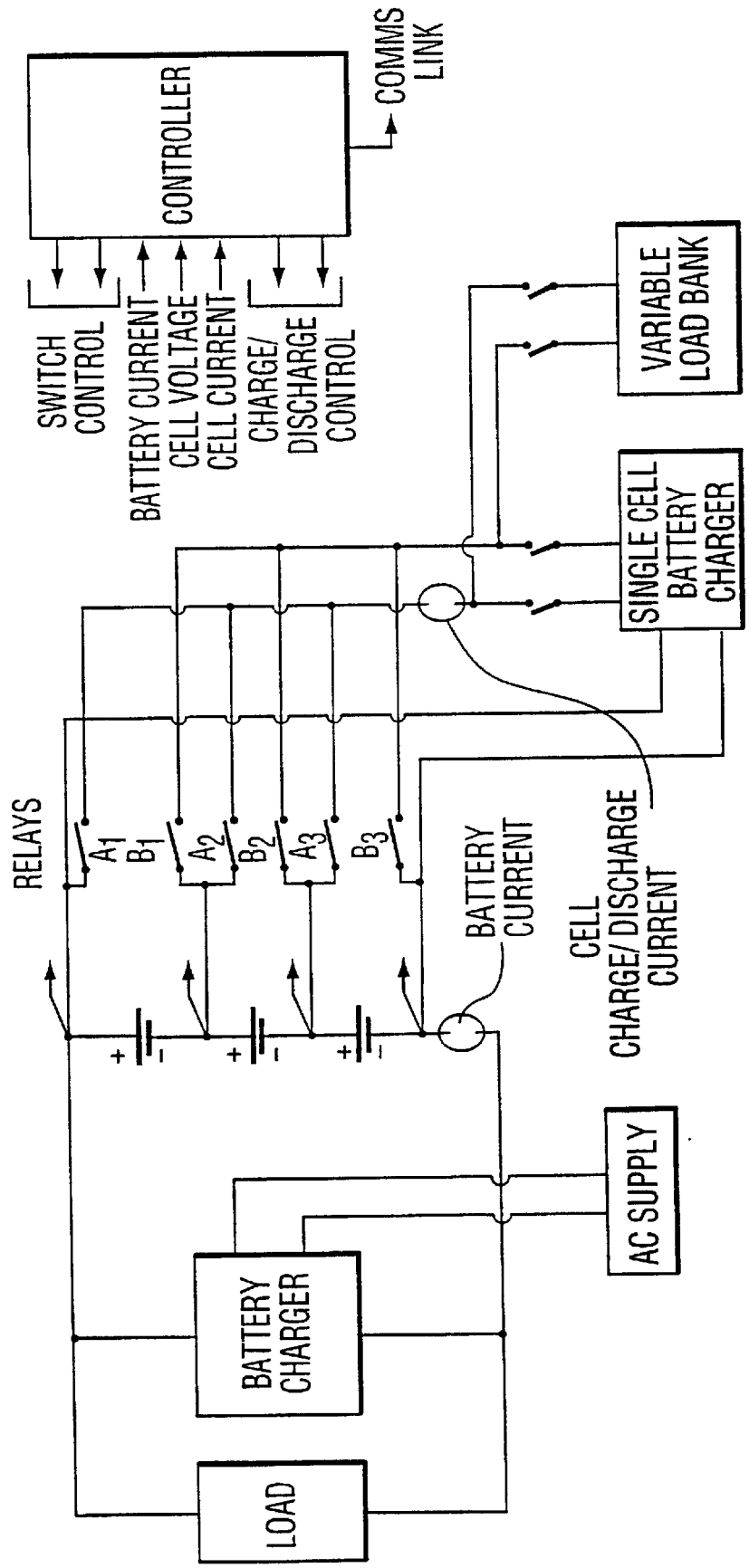
FIG. 1 is a schematic drawing of a preferred embodiment of the invention, depicting a bridged connection circuit with three modules.
Figure 2:
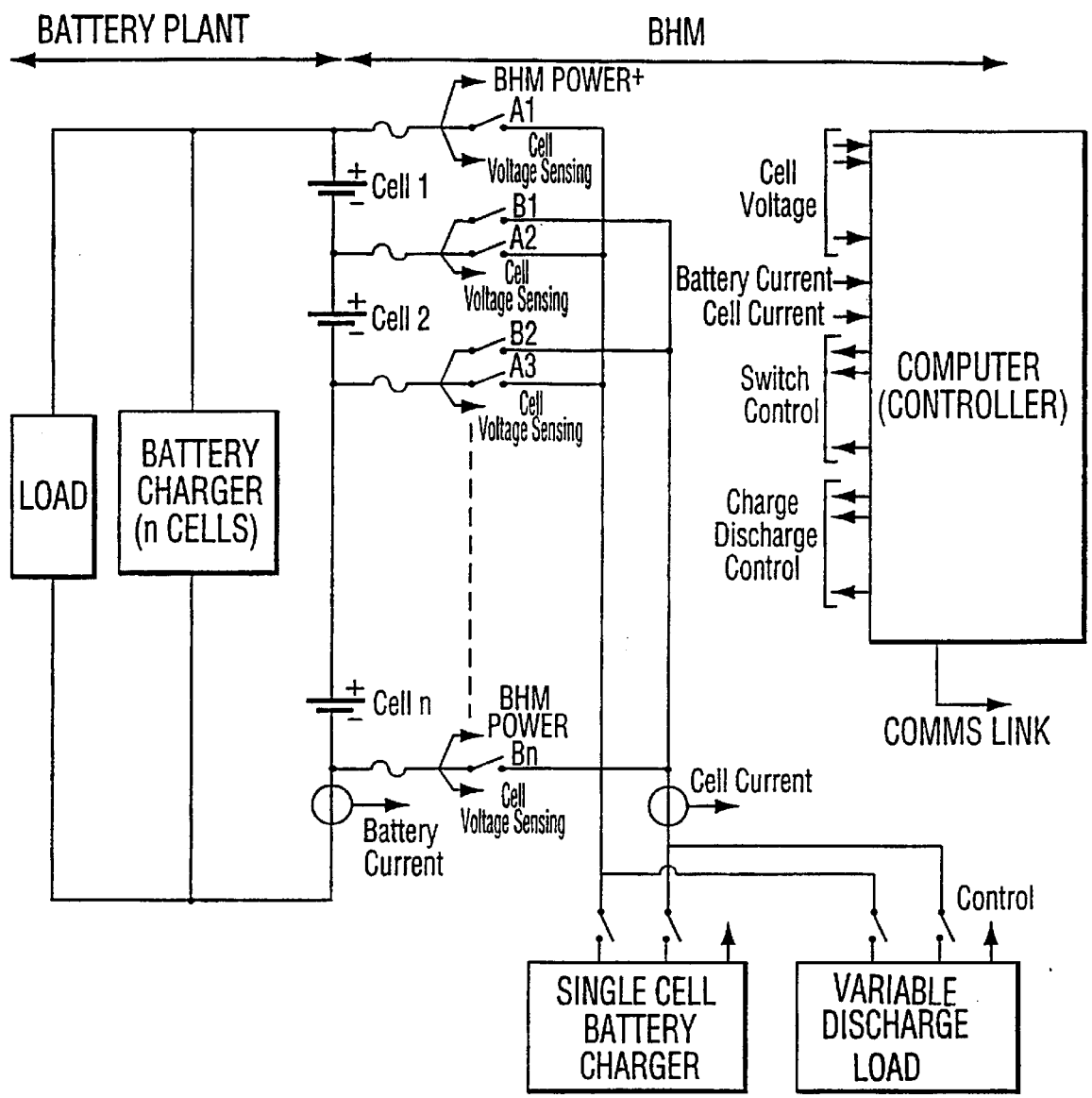
FIG. 2 is a schematic drawing of a further preferred embodiment of the invention, depicting a bridged connection circuit with "n" modules.

The invention makes use of a bridged connection circuit, which uses the principle of Kirchoff's law. Such an approach means that the module which is being assessed need not be isolated from the other modules comprising the battery pack. FIGS. 1 and 2 schematically represent a bridged connection. A bridged circuit ensures that the electrical integrity of the battery pack does not have to be broken in order to assess a single module. Using the algorithm outlined in FIG. 3, the capacity of each module is sequentially calculated. The computer controls the opening and closing of isolation relays, the variable discharge load, as well as the module battery charger. Further the computer senses the following: battery pack string current and voltage, selected module charge/discharge current, selected module voltage, ambient temperature, and battery pack and/or module temperatures.

In FIG. 2, the battery pack is shown as operatively connected to a circuit comprising a load and a battery charger which represents the primary power source and load for which the battery pack is intended to provide back up. In order for the operative capacity of the back-up battery pack to be accurately measured, an allowance must be made for the current which flows from the primary power source into the battery pack. Use of Kirchoff's law, where $\pm i_c = \pm i_p + \pm i_m$ where $\pm$ is positive for charge and negative for discharge, $i_c$ is module current, $i_p$ is current of the primary power circuit, and $i_m$ is the current of the monitor device, enables the PLC to accurately and selectively measure the operative capacity of a given module within the battery pack without isolating or disengaging the module from the other modules which comprise the battery pack.

In operation, the controller selectively controls and coordinates the opening and closing of the switches which connect the battery charger and the variable discharge load. Where it is desired to measure the capacity of module or cell 1, isolation relays A1 and B1 are closed by command of the PLC, which then closes the relays which connect the variable discharge load with the battery. The discharge circuit which is thus created enables module or cell 1 to be discharged across the variable discharge load. Module current is measured by a reader within the circuit and fed back to the PLC. The PLC then causes the relays connecting the variable discharge load to the battery to open, and then closes the relays which connect the battery charger with the battery, thereby defining a charging circuit which recharges module 1 up to a threshold level which is consistent with the useful capacity of the other modules within the string. The procedure is then sequentially repeated for the remaining modules 2, 3, . . . n within the string.

The programmable logic controller comprises, or is connected to at least one module voltage reader; at least one battery pack current reader and module current reader; a switch controller to control the isolation relays; a controller for said variable discharge load means and said single module battery charger (charger/discharger controller).

Both the variable discharge load and battery charger output are adjusted according to the ambient battery and module temperature present to prevent battery damage. As well, the computer calculates the a-h (ampere-hour) capacity of each battery cell by integrating the discharge current over the time taken to reach the cut-off voltage threshold, or the energy capacity by the above integration of current times voltage over discharge time in hours. An alternative to using computer control of the variable discharge load and battery charger is direct control using linear circuits.

The means used to discharge the module may be a use specific variable discharge profile, constant current, constant resistance, or constant power. The method chosen will depend on the battery technology and the normal usage. To implement these methods, a variable resistor or the like is typically used.

The battery charger used to recharge the module under scrutiny may operate with a variety of algorithms including constant voltage/current, constant power and fast charge methods, including pulse charging.

Figure 3:
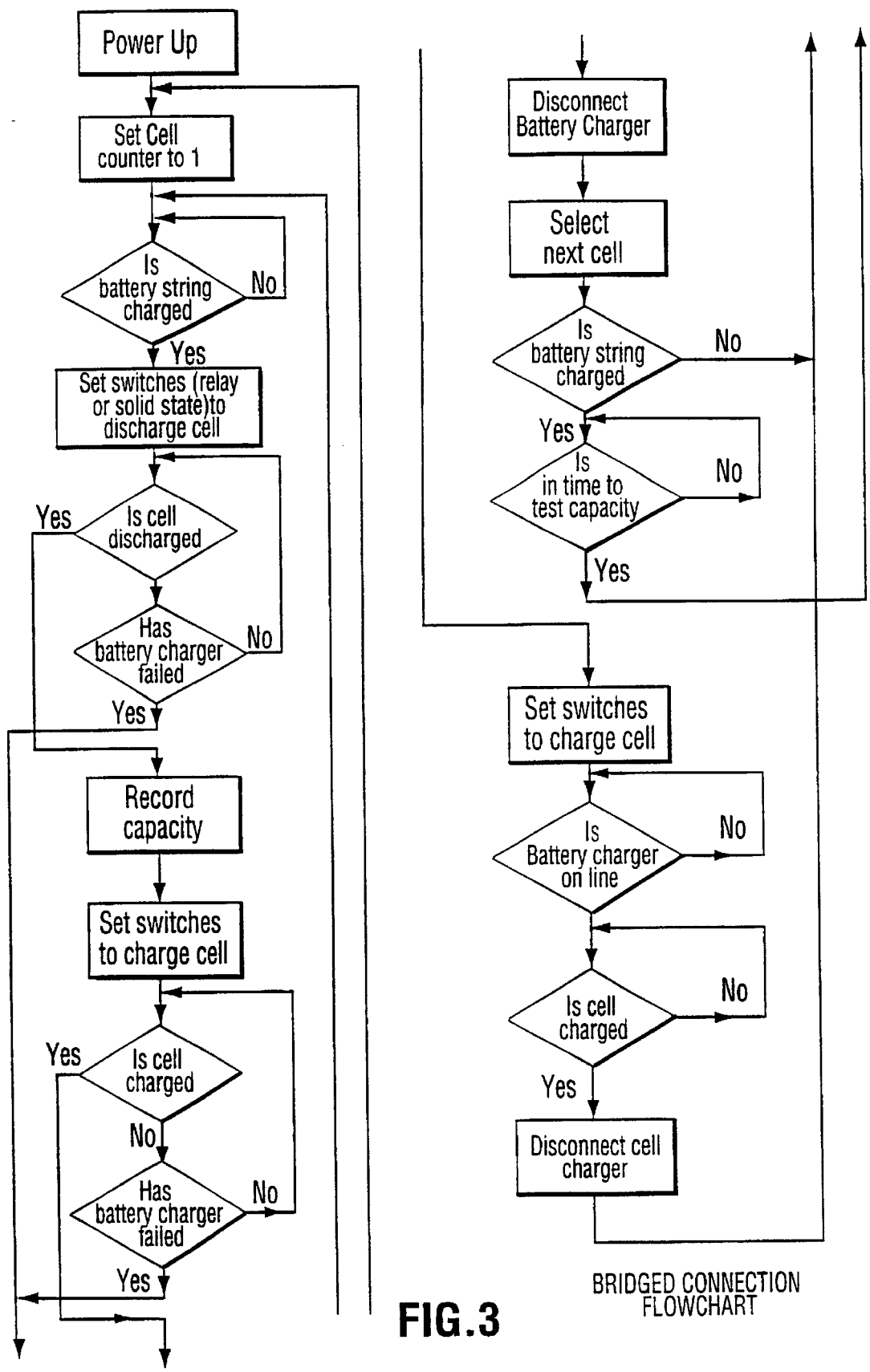
FIG. 3 is a flowchart, schematically depicting operation of the present invention.

In another preferred embodiment, relays A, B and C shown in FIGS. 2 and 3 may be replaced with solid state switches. However, solid state devices have the following characteristics which affect their suitability as replacements for relays:

1) They tend to have a voltage drop when conducting current. In the inserted connection embodiment, the battery voltage under load would be reduced somewhat (a fraction of a volt). In the case of the bridged connection, this problem could be reduced by sensing battery voltages at the connection to the invention;

2) Usually, two such solid state devices are needed for conducting in two directions. This increases the cost and complexity of the design;

3) Inputs are not isolated from outputs. This is somewhat problematic, since the monitor circuit. needs to connect to points up and down the chain of modules making up the battery. If the battery voltage exceeds 30 volts, optical isolation is needed which further complicates the design.

Because of the problems outlined above, the use of solid state switches as replacements for relays A, B and C would be determined on a case by case basis. The most likely applications would be for batteries having voltages below 30 volts or with currents below a few amperes, or where the battery power levels are not much larger than the relay drive requirements or where the use of electromechanical relays is undesirable for other reasons.

The invention works as an integral part of the battery and is designed to continue to operate in the event of an AC power failure, and is able to provide a full load current to substitute for a partially discharged module. This ensures that the useful capacity of the battery pack is available and that the module is protected from reverse-voltage damage.

So that no capacity is lost in the unlikely event of the module battery charger failing when the isolated battery is discharged, extra capacity is provided in the form of an external module. This module will normally be float charged by the invention. When the battery charger fails during a discharge cycle, the external module or battery will be used to power the battery charger.

The device of the present invention may further comprise an alarm circuit which conveys an audible or visible warning signal that the capacity of the battery pack has fallen below useful level, which is particularly important where the battery pack is being used as a back-up power source. This provides the option of replacing individual batteries from the battery instead of the whole pack, thereby providing a substantial increase in battery pack life and a resulting decrease in battery cost to the user.

Figure 4:
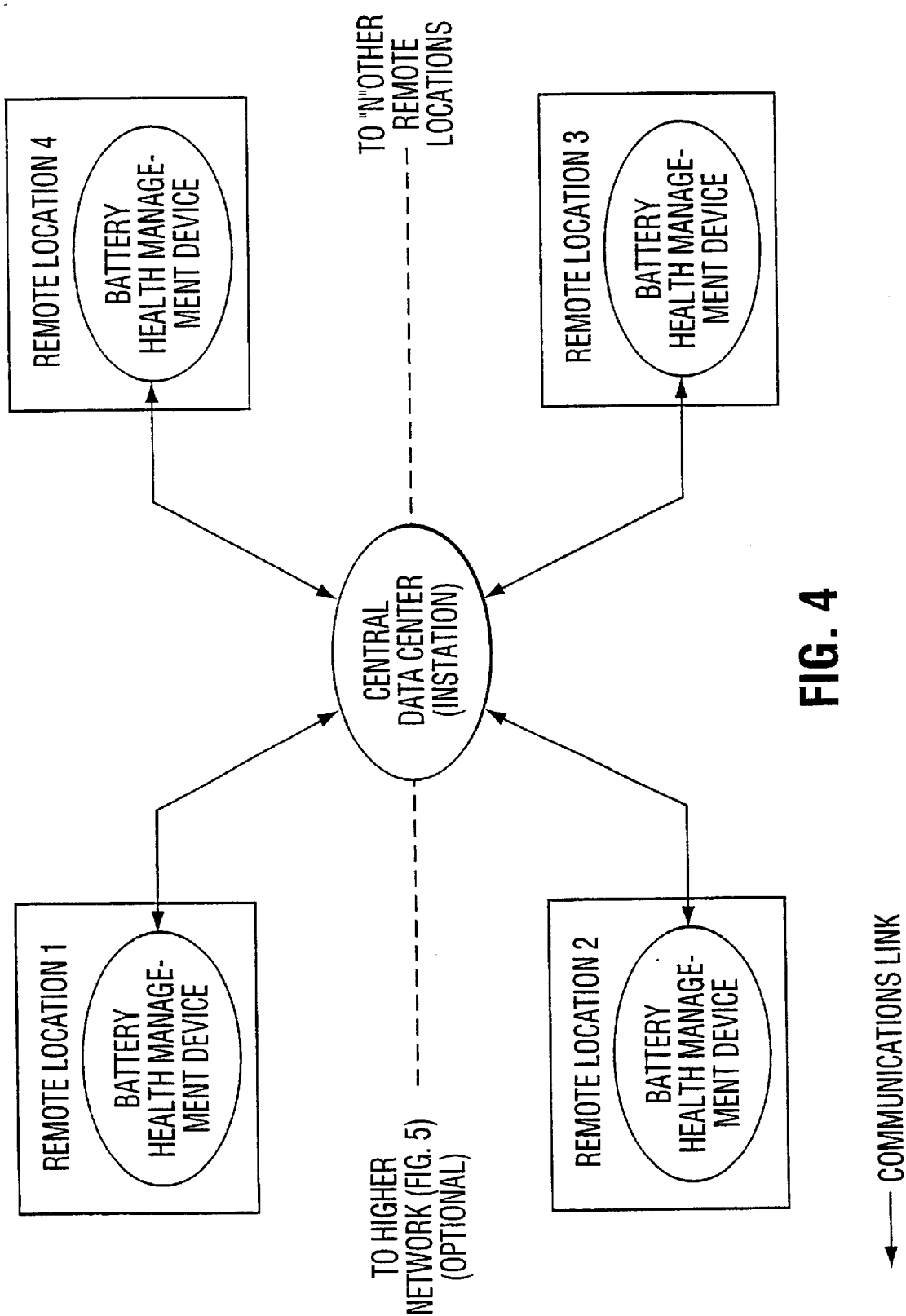
FIG. 4 is a schematic representation of the network management system, being a further embodiment of the invention

As depicted by FIG. 4, a plurality of the devices of the present invention may be networked to permit the gathering of data required for the effective management of systems with multiple battery installations. The data collected from the network is collated in one central data center. This eases the problem of handling a large amount of data, enables the analysis of standby power in large, complex systems, which facilitates the making of rapid, well-informed decisions.

The embodiment shown in FIG. 4 is a network of a plurality battery health management devices (shown in FIGS. 1 or 2 herein) installed in conjunction with the battery back up power sources for multiple, remote installations at sites on a telecommunications or other similar network or system. The remote battery health management devices are linked by multiple communications or sub-networks to one or more instations. The instation is equipped with suitable software to enable the instation to log data from the remote installations, generates alarms, produce statistics, group data in tables for comparison, plot trends, extrapolate data, generate reports and assist in record keeping.

The network shown in FIG. 4 is application specific and focuses on assisting in the routine health management (including monitoring or power outages) of a remote battery, such as remote cellular site. Because of the emphasis on routine maintenance, the instation presents information such as battery back time remaining, alarms, maintenance records, site down time and power outages records. The system is equipped with extensive database facilities that are used for trending or to provide historical evidence of battery system status.

Figure 5:
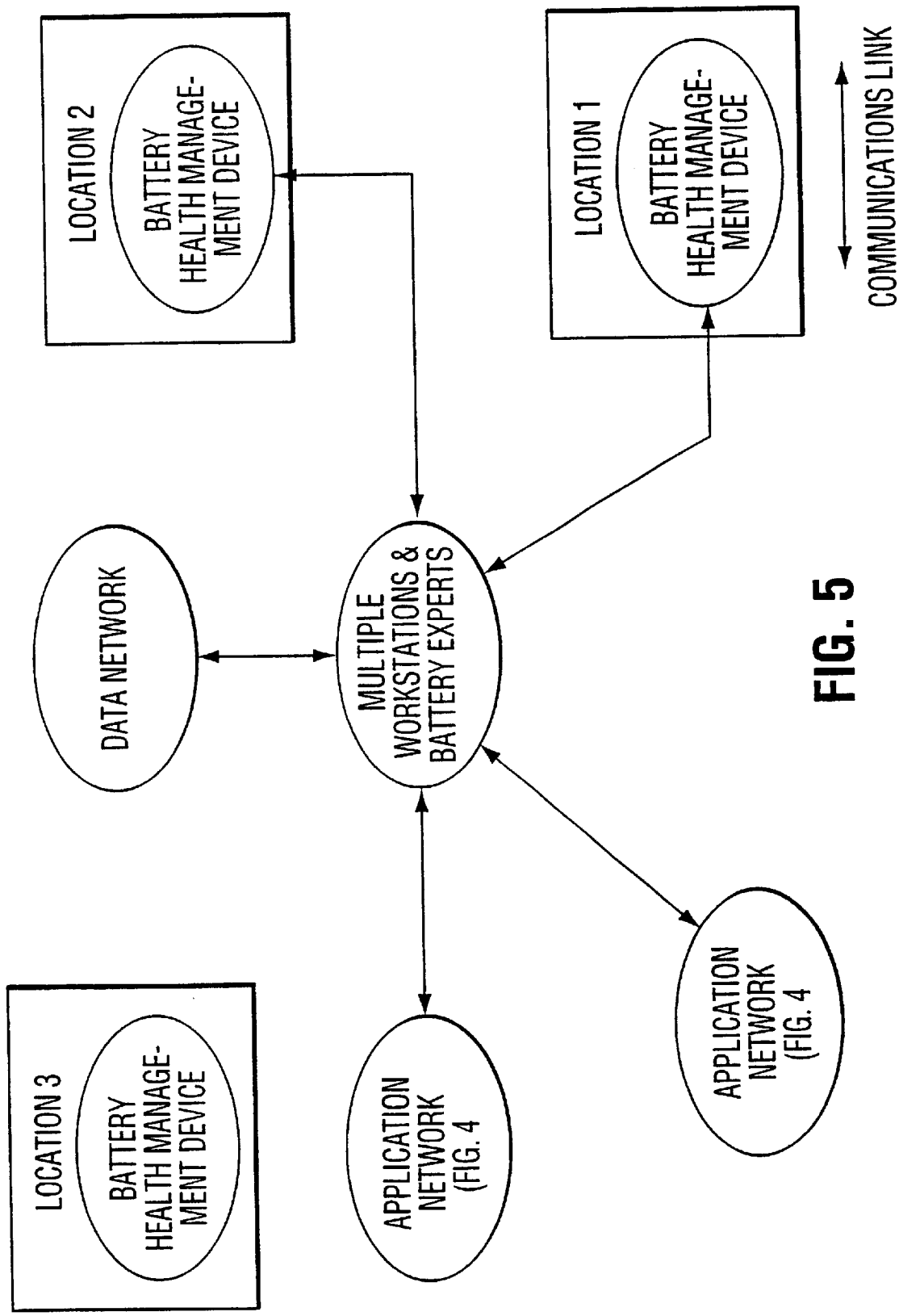
FIG. 5 is a schematic representation of an enhanced battery management network, being a further embodiment of the invention

A more sophisticated type of network is depicted in FIG. 5 which comprises a plurality of individual battery health management installations and/or one or more application specific networks. All of the data collected at the individual installations or sites on this network are collated at a master control center which is equipped to manage battery maintenance of individual sites or systems by providing routine monitoring, and/or diagnostic assistance. The master control center may be staffed with personnel who are well acquainted with battery systems and maintenance and who are able to analyse problems as reflected by the incoming data, and who can further provide and implement constructive and remedial advice.

Figure 6:
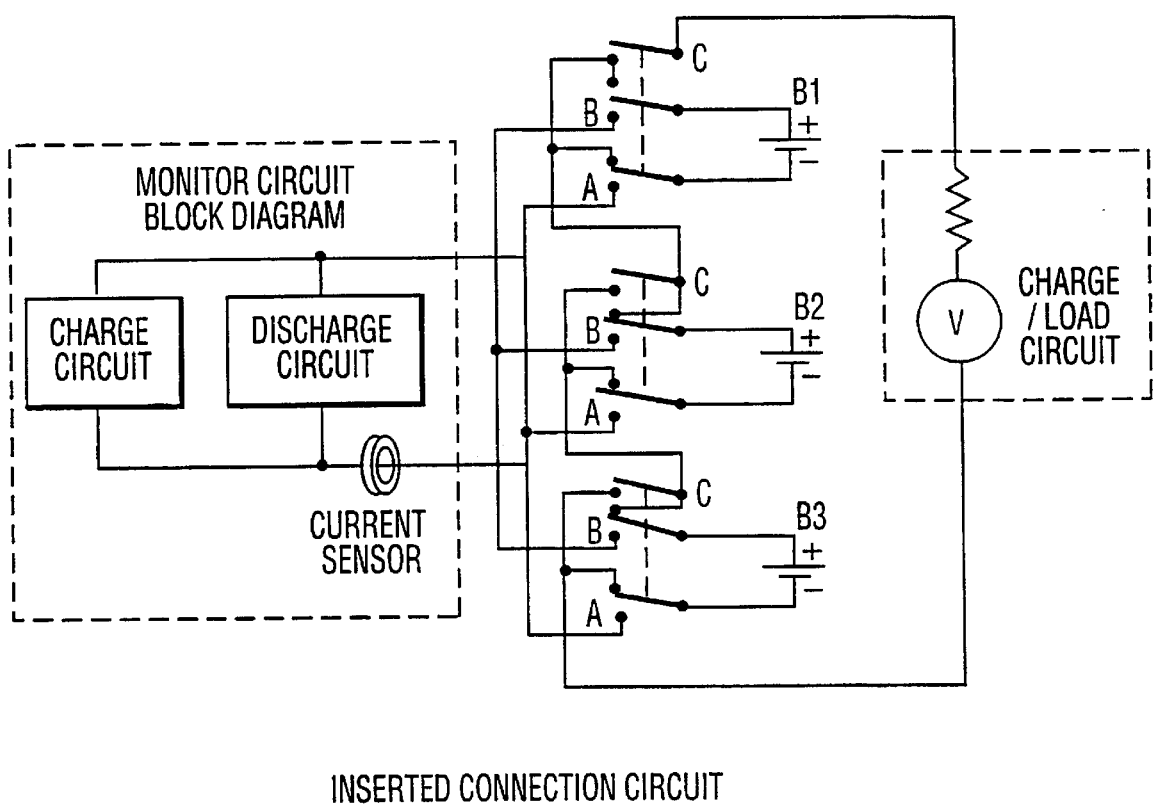
FIG. 6 is a schematic drawing of an optional inserted connection circuit

Optionally, a battery health management device shown as sites in the networks depicted in FIGS. 4 and 5 may use an inserted connection circuit, shown in FIG. 6, in place of the bridged connection circuit shown in FIGS. 1 and 2.

An inserted connection circuit isolates one of the multiple modules in the battery pack (typically nine or eleven modules) by taking the cell out of the trickle/float charge circuit and then performing a discharge of the battery module which drains the energy of the module into variable discharge means such as a fixed resistance heater or similar device at the normal rated load capacity for that module. The PLC then records which module is being discharged, and how long it takes to discharge to a pre-programmed cut-off voltage. This information is then used to calculate how much energy the module was able to deliver under actual loaded conditions, thereby providing a real measure of its useful capacity. The information on module capacity is provided by way of a liquid crystal display, or similar means, and is given in watt-hours, ampere-hours; % of "as new" or the time to failure under load in minutes, whichever is required by the end user. When the measured capacity falls below a pre-defined threshold an alarm will be triggered, signalling the need for battery or module replacement. The battery module charger will be engaged to recharge the discharged module.

In the inserted connection circuit shown in FIG. 6, batteries B1, B2 and B3 operate a charge/load circuit V. Isolation relays or contacts A and B connect an individual module to a monitor circuit, while contact C closes the gap in the battery created by the removal of the module. When relay contact C is closed, the open circuit formed by the removal of the battery module is closed, thereby allowing current to flow through the charge/load circuit. When isolation relays A, B are closed, an individual battery module can be isolated and connected to the monitor circuit. The monitor circuit discharges the isolated battery module and charges it as required using feedback provided by the current sensor and the preset voltage limits.

In the event of an AC mains failure, the relays must continue to operate, otherwise a discharged module would be reintroduced into the battery pack, reducing the useful capacity of the battery pack.

The battery voltage would normally be (Vc*N−1) where Vc is the nominal module voltage and N is the number of modules in the battery. As the monitor circuit moves from one module to the next, it causes a disruption in the battery pack voltage. The battery pack momentarily goes open-circuit, then the voltage jumps to Vc*N, then the battery pack goes open-circuit again, then finally the voltage returns to (Vc*N−1).

The module to be measured is accordingly isolated from the other modules comprising the battery pack by the selective engagement of isolation relays. The module is then discharged, its capacity is measured by the PLC as a function of the discharge load, and it is then recharged. The isolated module is temporarily unable to contribute to the output of the battery. The procedure is sequentially repeated, at selectable times, for the remaining modules which comprise the battery pack.

Only one battery module at a time is discharged so that the system is never more than 1/9 or 11% short of its maximum ampere-hour or watt-hour energy capacity (in the case of a nine cell battery pack). In the event of an AC power outage (i.e. a situation where the DC battery pack is engaged), when one of the modules is not fully charged, this module is kept out of the circuit by the use of isolation relays.

As an alternative to this method, an identical module to the battery modules in the battery pack can be added to the battery pack; for example, making a 9 module battery pack into a 10 module battery pack. In this case, the module battery charger will be powered from the battery pack.

In the event that there is a battery module with less useful capacity than the other modules in the pack, the invention can assess the state of health of the reduced capacity module and electrically isolate it from the rest of the battery pack, until such time as the rest of the pack has a poorer performing module than the isolated, reduced capacity module.

The embodiments of the invention in which an exclusive property or privilege is claimed are defined as follows:

1. A battery management system for directly assessing the useful capacity of at least one battery module in a battery pack, the system comprising:
    a programmable logic controller for controlling the system and for calculating data regarding the useful capacity of the at least one battery module
    a monitor circuit connected to the programmable logic controller, the monitor circuit including:
        charging means for charging the at least one battery module
        discharging load means for discharging the at least one battery module
        at least one current measurement means for measuring a current of the at least one battery module
    a plurality of relays connected between the monitor circuit and the battery pack
    wherein
        the at least one current measurement means measures a current of the at least one battery module and the programmable logic controller calculates data regarding the useful capacity of the at least one battery module based on the current of the at least one battery module
        the programmable logic controller selectively opens and closes the plurality of relays to define a circuit chosen from the group comprising:
            a discharge circuit which enables the at least one battery module to be discharged by the discharging load means
            a charging circuit which enables the at least one battery module to be charged by the charging means.

2. A system as claimed in claim 1 further including recording means for recording said data regarding the useful capacity of the at least one battery module.

3. A system as claimed in claim 1 wherein said relays are selected from the group consisting of multi-pole relays, contactors, or solid state switching devices.

4. A system as claimed in claim 1 wherein the discharging load means for discharging the at least one battery module further includes means for discharging the at least one battery module under a predefined load.

5. A system as claimed in claim 1 wherein the discharging load means for discharging the at least one battery module further includes means for variably discharging the at least one battery module.

6. A system as claimed in claim 1 wherein the programmable logic controller includes:
    a switch controller to control the plurality of relays
    a controller for the discharging load means and
    a controller for the charging means.

7. A system as claimed in claim 1 wherein the at least one current measurement means measures a discharge current of the at least one battery module.

8. A system as claimed in claim 1 wherein the at least one current measurement means measures a charge current of the at least one battery module.

9. A method of sequentially assessing a useful capacity of a plurality of battery modules which define a battery pack, the method comprising:
    a) selecting a selected module from the plurality of battery modules for assessment;
    b) connecting said selected module to a discharging load means for discharging a module
    c) measuring parameters which are used to determine the useful capacity of said selected module while said selected module is under load;
    d) determining whether the useful capacity meets a predefined threshold
    e) disconnecting said selected module from said discharging load means
    f) performing an action chosen from the group comprising:
        recharging said selected module by connecting said selected module to a charging means for charging a module
        generating an alarm signal if said useful capacity does not meet the predefined threshold
wherein the above method is coordinated by a programmable logic controller.

10. A method as claimed in claim 9 wherein the discharging load means discharges the selected module under a predefined load.

11. A method as claimed in claim 9 wherein the discharging load means discharges the selected module under variable loads.

12. A method as in claim 4 wherein step d) further includes recording capacity data regarding the useful capacity of the selected module.

13. A method as claimed in claim 12 wherein the group in step f) further includes
    determining a capacity of other modules in the battery pack from recorded capacity data of other modules in the battery pack and recharging the selected module by connecting the selected module to the charging means, the selected module being recharged to a recharge level consistent with the capacity of other modules in the battery pack.

14. A device for cycling battery modules in a battery pack while the battery pack remains in service, the device including:
    charging means for charging a battery module
    discharging means for discharging a battery module a plurality of relays coupled between the charging means, the discharging means, and the battery modules a programmable logic controller for controlling the plurality of relays, the battery module recharging means, and the battery module charging means wherein the programmable logic controller selectively opens and closes the plurality of relays to couple at least one battery module in the battery pack to a component chosen from the group comprising:
the charging means and
the discharging means.

15. A device as claimed in claim 14 wherein the charging means uses a plurality of different recharge methods to recharge the at least one battery module in the battery pack.

16. A device as claimed in claim 15 wherein the plurality of different recharge methods are chosen from the group comprising:
a) constant voltage
b) constant current
c) constant power
d) fast charge
e) pulse charging.

17. A method as claimed in claim 14 wherein the discharging means discharges the at least one battery module under a predefined load.

18. A method as claimed in claim 5 wherein the discharging means discharges the at least one battery module under variable loads.

19. A networked system for managing the capacity of remote batteries, the system including:
a central data center for receiving data regarding the capacity of a plurality of remote battery packs,
a plurality of satellite nodes, each satellite node transmitting data regarding the capacity of at least one remote battery pack to the central data center
a communications network connecting the satellite nodes to the central node
a plurality of battery health management units which calculate and gather data regarding the capacity of individual modules in a battery pack such that a capacity of the battery pack is an aggregate of the capacity of the individual modules in the battery pack, each battery health management unit having:
a monitor circuit for charging and recharging of battery modules and for measuring at least one measured parameter related to the capacity of a battery module
a plurality of relays coupled between the monitor circuit and the battery pack
a programmable logic controller
for calculating data regarding the capacity of individual modules in a battery pack based on the at least one measured parameter and
for controlling the monitor circuit and the plurality of relays to selectively charge and discharge individual modules in the battery pack
wherein each battery health management unit is connected to a node chosen from the group comprising:
a satellite node
a central data center.

20. A networked system as claimed in claim 19 wherein
the central data center is a master control center which provides a plurality of services including routine monitoring and diagnostic assistance
each satellite node is a nodek chosen from the group comprising:
a battery health management device which gathers data regarding the health of at least one battery pack;
an instation node which receives battery pack health data from a plurality of battery health management devices.

21. A networked system as claimed in claim 19 wherein each instation node provides a plurality of services based on battery health pack data received from a plurality of battery health management devices, the services including:
logging battery health pack data
generating alarms
producing statistics
generating reports
collating data to produce an instation data report wherein the instation data report is transmitted to the central data center.

22. A networked system as claimed in claim 7 wherein
the central data center is an instation node which provides a plurality of services based on data regarding the capacity of a plurality of remote battery packs
each satellite node is a battery health management device which gathers and transmits to the central data center data regarding the health of at least one battery pack.

* * * * *